United States Patent [19]
Sugiyama et al.

[11] Patent Number: 6,166,914
[45] Date of Patent: Dec. 26, 2000

[54] IC CARD HAVING A REINFORCING MEMBER FOR REINFORCING A SEALING MEMBER

[75] Inventors: Satoru Sugiyama; Toyoji Kanazawa; Tetsuo Satoh, all of Tanashi; Mikio Yamaguchi; Masashi Takahashi, both of Saitama, all of Japan

[73] Assignee: Citizen Watch Co., Ltd., Tokyo, Japan

[21] Appl. No.: 09/308,382

[22] PCT Filed: Oct. 15, 1998

[86] PCT No.: PCT/JP98/04668

§ 371 Date: May 18, 1999

§ 102(e) Date: May 18, 1999

[87] PCT Pub. No.: WO99/21132

PCT Pub. Date: Apr. 29, 1999

[30] Foreign Application Priority Data

Oct. 16, 1997 [JP] Japan .................................. 9-284087

[51] Int. Cl.[7] .............................. H05K 1/14; H01L 23/28; G06K 19/077
[52] U.S. Cl. ......................... 361/737; 361/801; 174/52.3; 235/492
[58] Field of Search ...................... 361/736, 737, 361/728, 752, 758, 801, 810, 825; 257/679; 220/4.02; 235/492; 439/946; 174/35 R, 52.3

[56] References Cited

U.S. PATENT DOCUMENTS

| 4,803,546 | 2/1989 | Sugimoto et al. ............... 361/718 X |
| 5,081,067 | 1/1992 | Shimizu et al. ............... 361/688 X |
| 5,394,011 | 2/1995 | Yamamoto et al. ............... 257/693 |
| 5,940,279 | 8/1999 | Gademann et al. ............... 361/823 |

FOREIGN PATENT DOCUMENTS

| 62-201295 | 9/1987 | Japan . |
| 64-40397 | 2/1989 | Japan . |
| 1-184193 | 7/1989 | Japan . |
| 8-267973 | 10/1996 | Japan . |

Primary Examiner—Jayprakash N. Gandhi
Attorney, Agent, or Firm—Kanesaka & Takeuchi

[57] ABSTRACT

In an IC card in which an IC module constituted by a terminal plate 1 having a connection terminal pattern(3), arranged on a surface of an insulating substrate (2), for external power supply, signal connection, and grounding, an IC chip (4) mounted on the rear surface of the terminal plate 1 and electrically coupled to the connection terminal pattern (3), a sealing member (5) for the IC chip, and a reinforcing member (6) for reinforcing the sealing member (5) is mounted on a card base, the reinforcing member (6) consists of a conduction material, and integrally constituted by a ring portion (7) for covering the outer periphery of the sealing member (5) and a flange portion (8), having almost the same shape as that of the outer periphery of the terminal plate (1), for covering the rear surface of the insulating substrate (2). Therefore, an IC card which is strong to damage caused by disconnection of a bonding wire due to peeling between the insulating substrate and the sealing member caused by external force can be provided at low cost.

18 Claims, 6 Drawing Sheets

IC CARD HAVING A REINFORCING MEMBER FOR REINFORCING A SEALING MEMBER

TECHNICAL FIELD

The present invention relates to an IC card used as various cards such as a cash card or a credit card and, more particularly, to an IC card in which an IC module mounted on the IC card is reinforced.

BACKGROUND ART

In an IC card used as various cards, precious data are stored. For this reason, an IC module mounted on the IC card also requires reliability.

A conventional IC module, as shown in FIG. 8, is constituted by a terminal plate 1 in which connection terminal patterns 3 for external power supply, signal connection, and grounding are arranged on one surface of an insulating substrate 2, an IC chip 4 arranged on the rear surface of the terminal plate 1, bonding wires 15 for electrically connecting pad portions of the IC chip 4 to the rear surfaces of the connection terminal patterns 3 through holes 16 of the insulating substrate 2, and a sealing member 5, consisting of an insulating resin, for protecting the IC chip 4 and the bonding wires 15.

In using, keeping, or the like of IC cards, the IC cards tend to be very easily influenced by external force such as bending or impact. For this reason, external force also acts on the IC modules such that the IC modules are damaged.

Therefore, in a prior art, as shown in FIG. 9, a ring-shaped reinforcing member 60, consisting of a hard material such as metal or ceramic, for reinforcing the sealing member 5 is attached, and external force is received by the reinforcing member 60 to make a device for preventing damage of an IC module. However, even in this structure, damage caused by external force cannot be sufficiently prevented.

More specifically, two types of manners are mainly known as damage manners of an IC module. One is caused by cracking of the IC chip 4, and the other is caused by disconnection of the bonding wires 15 due to peeling between the insulating substrate 2 and the sealing member 5 as shown in FIG. 10.

In this case, an IC module in which a conventional ring-shaped reinforcing member 60 shown in FIG. 9 is provided is sufficiently effective in reinforcement for the cracking of the IC chip 4. However, this IC module is not sufficiently effective in preventing disconnection of the bonding wires 15 caused by the latter peeling between the insulating substrate 2 and the sealing member 5 because prevention of peeling depends on the adhesive strength between the reinforcing member 60 and the insulating substrate 2 only by an adhesive agent 13 and because the adhesive strength depends on the strength of the insulating substrate 2 itself.

In other words, when external force shown in FIG. 10 acts on the terminal plate 1, the insulating substrate 2 is relatively easily peeled from the reinforcing member 60. For this reason, not only the sealing member 5 but also the bonding wires 15 are disadvantageously disconnected.

The present invention has been made in consideration of the above circumstances, and has as its object to provide a low-cost IC card which can prevent disconnection of a bonding wire caused by peeling between an insulating substrate and a sealing member by external force and which is strong as a whole card.

DISCLOSURE OF INVENTION

In order to achieve the above object, according to the present invention, in an IC card in which an IC module constituted by a terminal plate having a connection terminal pattern, arranged on a surface of an insulating substrate, for external power supply, signal connection, and grounding, an IC chip mounted on the rear surface of the terminal plate and electrically coupled to the connection terminal pattern, a sealing member for the IC chip, and a reinforcing member for reinforcing the sealing member is mounted on a card base, the reinforcing member is integrally constituted by at least a ring portion for covering the outer periphery of the sealing member and a flange portion for covering the rear surface of the insulating substrate.

According to the IC card with the above arrangement, the reinforcing member constituted by the ring portion and the flange portion receives external force acting between the insulating substrate and the sealing member. For this reason, the reinforcing member prevents the insulating substrate from being peeled from the sealing member to prevent disconnection of the bonding wire caused by the peeling. As a result, a highly reliable IC card in which an accident that an IC module is damaged rarely occurs can be provided.

The invention of a second aspect is arranged such that the reinforcing member is constituted by a conductive member, and is electrically connected to the grounding connection terminal pattern. As the concrete arrangement, according to the invention of a third aspect, the insulating substrate has a through hole formed at a position corresponding to the grounding connection terminal pattern, and the reinforcing member has a projection portion projecting toward the insulating substrate. In the invention of the third aspect, the projection portion is fitted in the through hole to position the reinforcing member, and the reinforcing member is electrically connected to the grounding connection terminal pattern.

According to the IC card with the arrangement, since the reinforcing member is electrically connected to the grounding connection terminal pattern through the projection portion, the IC is not damaged by electrostatic discharging from a capacitor formed by the terminal pattern and the reinforcing member, and a shield effect can be expected.

The invention of a forth aspect is arranged such that the ring portion of the reinforcing member has a reinforcing rib located at the above IC chip.

According to the IC card with the arrangement, impact acting on the IC chip is received by the rib to prevent the IC chip from being damaged. For this reason, the IC card which is strong to external force can be obtained.

The invention of a fifth aspect is arranged such that the outer periphery of the flange portion of the reinforcing member has almost the same shape as that of the outer periphery of the terminal plate. The invention of a sixth aspect is arranged such that the flange portion is adhered to the insulating substrate with an adhesive agent. The invention of a seventh aspect is arranged such that the flange portion is adhered to a card base with an adhesive agent. In addition, the invention of a eighth aspect is arranged such that a plurality of window holes is provided for forming escape portions for an excessive adhesive agent.

According to the IC card with the above arrangement, the terminal plate is entirely protected by the flange portion, and the terminal plate can strongly withstand external force acting on the IC module. Since the layers of the adhesive agent for adhering the flange portion to the reinforcing member and to the insulating substrate are thin and strong, not only the strength of the IC module can be highly improved, but also the IC module can be fixedly mounted on the base. As a result, the whole of the IC card can be made more solid.

The inventions according to ninth to eleventh aspects are arranged such that the reinforcing members are manufactured by drawing of a thin plate, forging, and casting, respectively.

According to the IC card with the arrangement, since the reinforcing member can be mass-produced, a low-cost IC card can be provided.

BEST MODE FOR CARRYING OUT THE INVENTION

Embodiments of the present invention will be described below with reference to the drawings.

Figure 9:
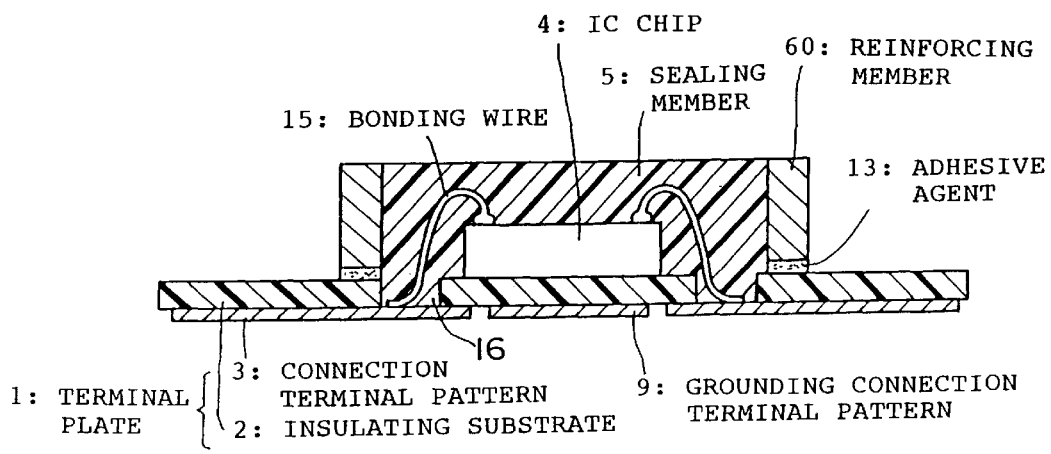
FIG. 9 is a sectional view of an IC module with a conventional reinforcing member.
Figure 10:
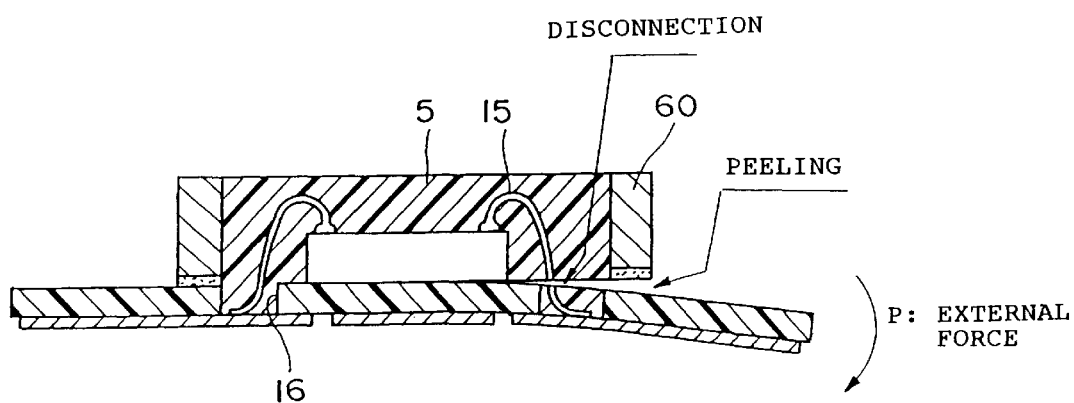
FIG. 10 is a sectional view showing a peeling state of the IC module with the conventional reinforcing member caused by external force.

The same reference numerals in the drawings denote the same parts shown in FIG. 9 or FIG. 10, to omit the explanations.

Figure 1:
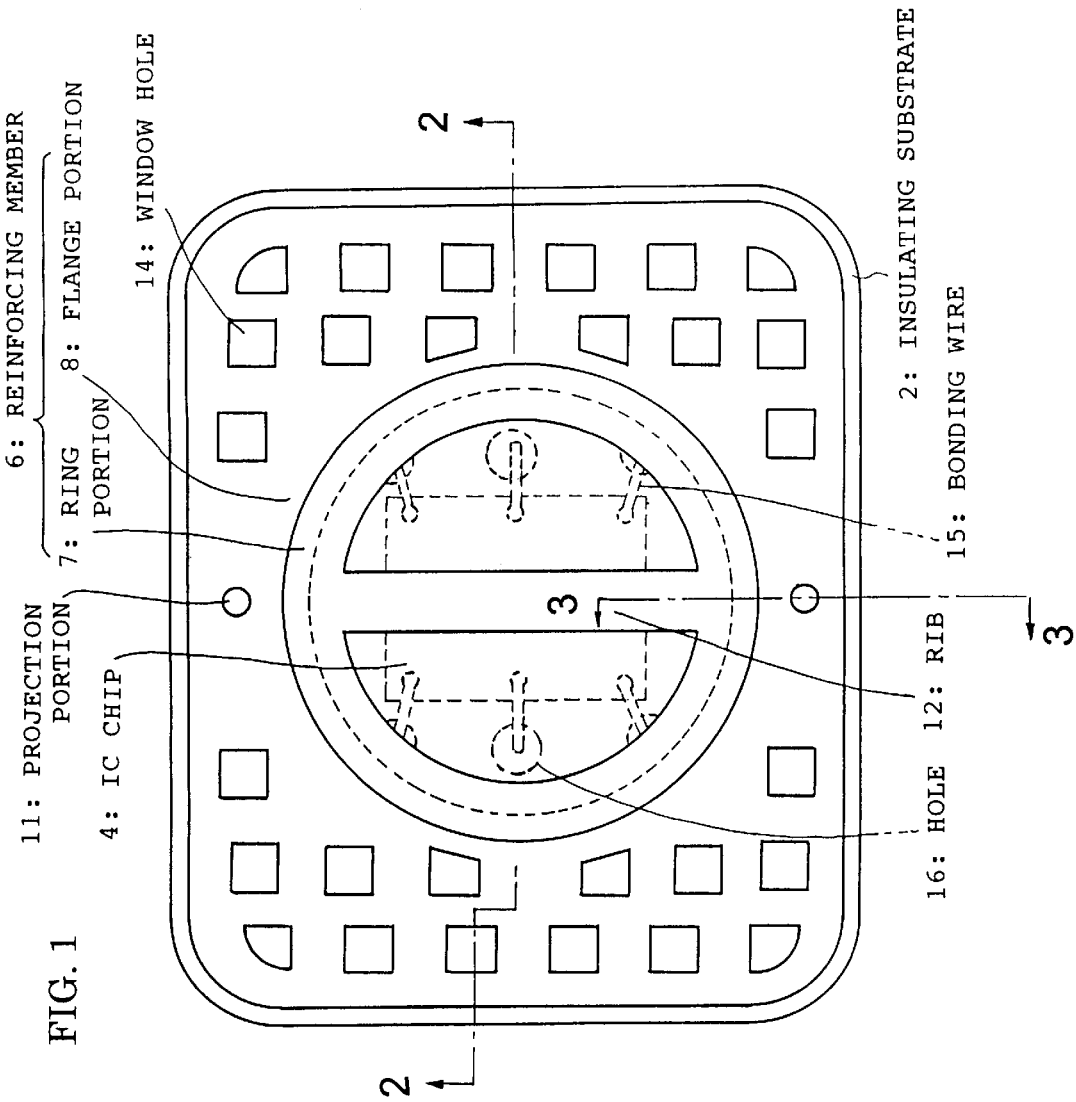
FIG. 1 is a plan view of an IC module of an IC card according to an embodiment of the present invention when viewed from a mounting side of an IC chip.
Figure 2:
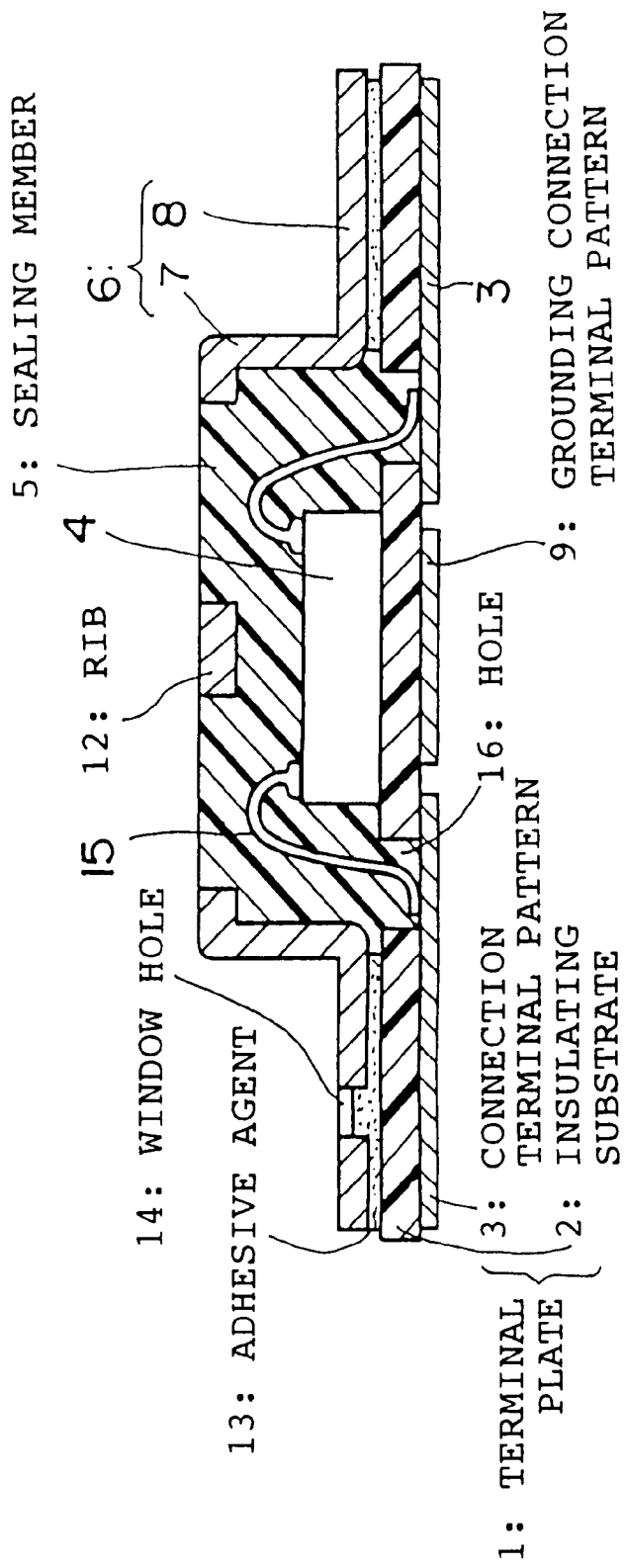
FIG. 2 is a sectional view of the IC module taken along line 2—2 in FIG. 1.

As shown in FIG. 1 and FIG. 2, an IC module according to this embodiment has a terminal plate 1 in which connection terminal patterns 3 are arranged on one surface of an insulating substrate 2, an IC chip 4 arranged on the rear surface of the terminal plate 1 and sealed by the sealing member 5, and bonding wires 15 for electrically connecting pad portions of the IC chip 4 to the rear surfaces of the connection terminal patterns 3 through holes 16 of the insulating substrate 2.

The reinforcing member 6 consists of a conductive material, and is integrally constituted by a ring portion 7 for covering the outer periphery of the sealing member 5 and a flange portion 8 for covering the insulating substrate 2. The shape of the outer periphery of the flange portion 8 has the same shape as that of the outer periphery of the terminal plate 1. The flange portion 8 is adhered to the insulating substrate 2 of the terminal plate 1 with an adhesive agent 13.

Figure 3:
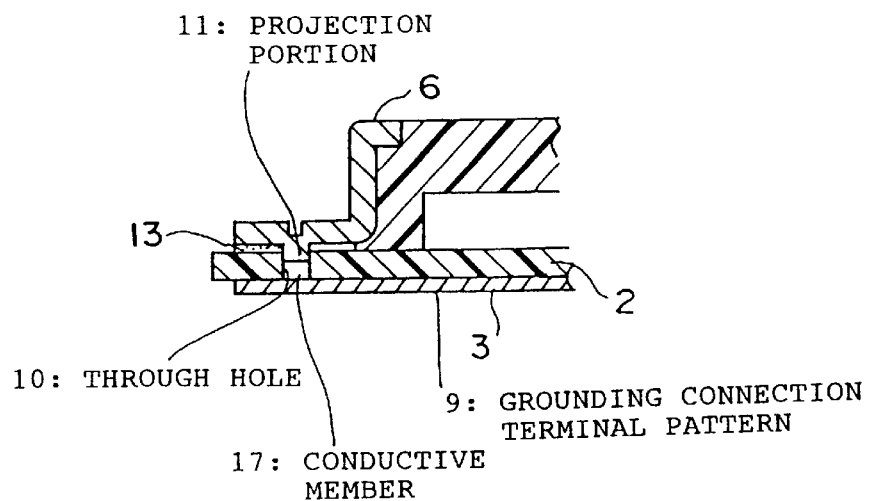
FIG. 3 is a sectional view of the IC module taken along line 3—3 in FIG. 1.
Figure 4:
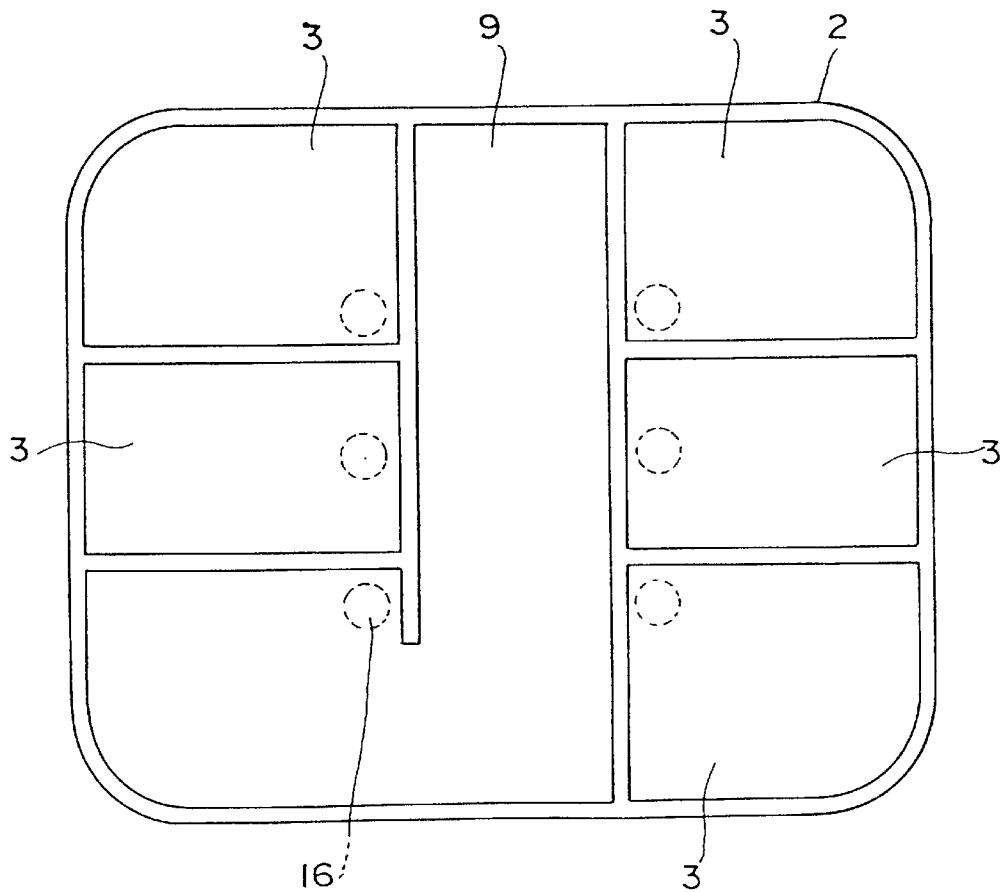
FIG. 4 is a plan view of the IC module shown in FIG. 1 when viewed from a connection terminal pattern side.

As shown in FIG. 3, the insulating substrate 2 has a through hole 10 at a position corresponding to a grounding connection terminal pattern 9. The reinforcing member 6 has a projection portion 11 projecting toward the insulating substrate 2. The projection portion 11 is fitted in the through hole 10 to position the reinforcing member 6.

The reinforcing member 6 is electrically connected to the grounding connection terminal pattern 9 through the projection portions 11 and a conductive member 17 such as a conductive adhesive agent. In this manner, the IC is not damaged by electrostatic discharging from a capacitor formed by the terminal pattern 9 and the reinforcing member 6, and a shield effect can be expected.

The ring portion 7 of the reinforcing member 6, as shown in FIG. 1 and FIG. 2, has a reinforcing rib 12 located above the IC chip 4 to improve the strength of the reinforcing member 6 and to protect the IC chip 4 from impacting external force. In the flange portion 8, a plurality of window holes 14 constituting adhesive agent puddles is formed. The adhesive agent 13 escapes from the window hole 14 to decrease the thickness of the adhesive agent layer, thereby improving the adhesive strength.

Figure 5:
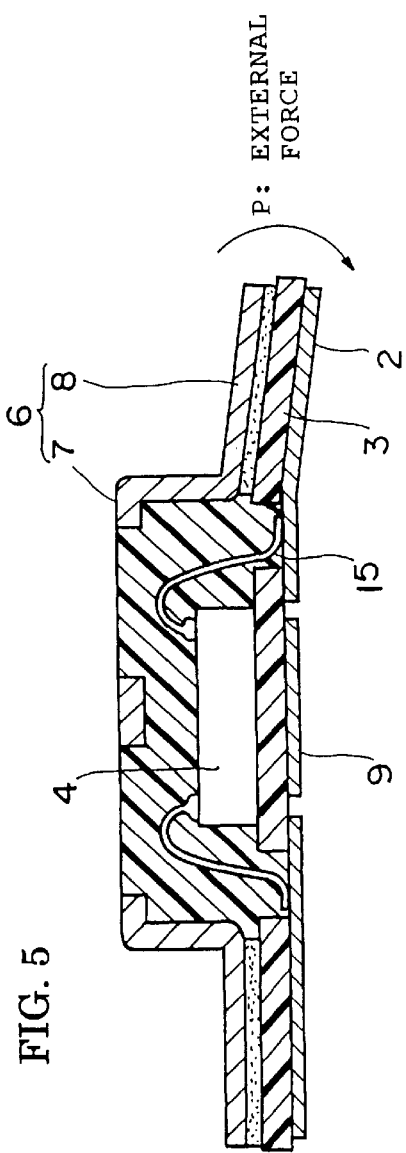
FIG. 5 is a sectional view showing deformation of the IC module shown in FIG. 1 caused by external force.

With this arrangement, external force P acting in the direction of an arrow in FIG. 5 is received by the reinforcing member 6. For this reason, the insulating substrate 2 is not peeled from the sealing member 5. As a result, a strong IC card structure which is not damaged by disconnection of the bonding wire 15 is obtained.

The reinforcing member 6 according to this embodiment is obtained by forming the various holes and the outer shape by trimming after drawing of a metal plate, and is manufactured by press working using progressive dies. For this reason, the parts cost of the reinforcing member 6 is low.

Figure 6:
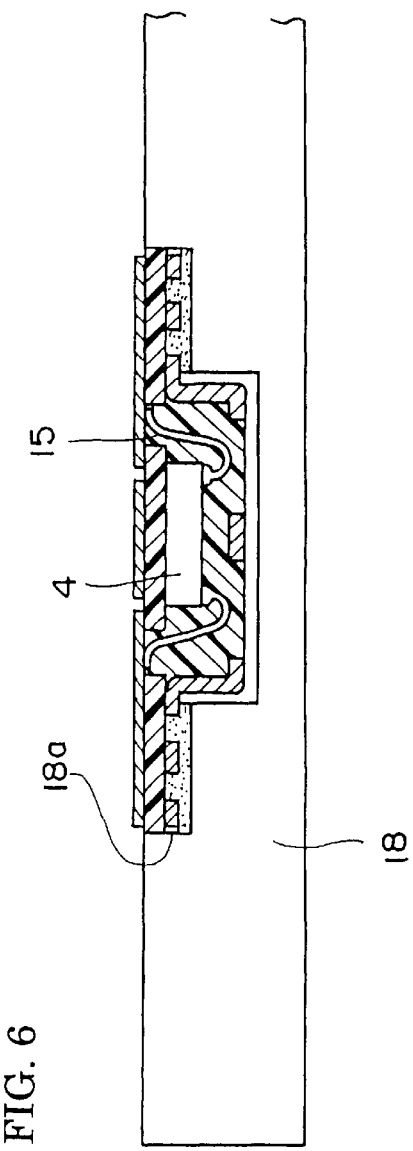
FIG. 6 is a sectional view of the IC card on which the IC module shown in FIG. 1 is mounted.

In mounting the IC module on a card base 18 for completing an IC card, as shown in FIG. 6, the IC module is engaged with a module mounting recessed portion 18a formed in the card base 18. The IC module is adhesively fixed to the recessed portion 18a of the card base 18 with an adhesive agent coated on the flange portion 8 of the reinforcing member 6. In this case, since an excessive part of the adhesive agent between the flange portion 8 and the recessed portion 18a of the card base 18 escapes from the window hole 14 of the adhesive agent puddle, a thin adhesive agent layer is formed to improve the adhesive force.

Figure 7:
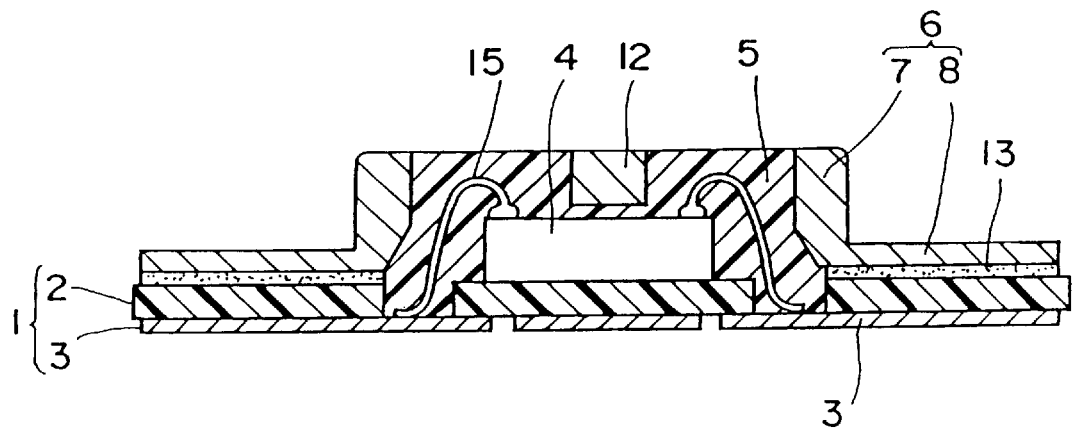
FIG. 7 is a sectional view of an IC module according to another embodiment of the present invention.
Figure 8:
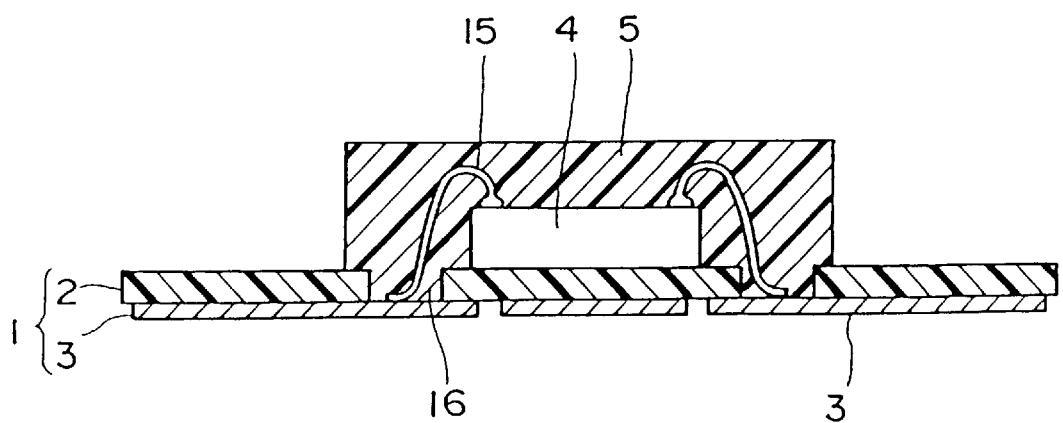
FIG. 8 is a sectional view of a conventional IC module.

The reinforcing member 6 can also be manufactured by forging or casting. In this case, a reinforcing member 6 shown in FIG. 7 is obtained.

As has been described above, according to the present invention, since the resistance of the IC module to external force can be improved, an accident that the IC module is damaged by disconnection of a bonding wire caused by peeling between an insulating substrate and a sealing member can be prevented, and a highly reliable IC card can be provided. In addition, since the IC module can be fixedly mounted on the card base, the whole of the IC card can be made solid.

Industrial Applicability

The present invention is suitably used, as an IC card having a reinforced IC module mounted on the card, in various cards such as a cash card or a credit card.

What is claimed is:

1. An IC card comprising:
   a card base, and
   an IC module mounted on the card base and including an insulating substrate; a terminal plate arranged on a surface of the insulating substrate and having connection terminal patterns for external power supply, signal connection, and grounding; an IC chip mounted on a rear surface of the terminal plate and electrically coupled to the connection terminal patterns; a sealing member for the IC chip; and a reinforcing member for rinforcing the sealing member integrally formed of at least a ring portion for covering an outer periphery of the sealing member and a flange portion for covering a rear surface of the insulating substrate, said reinforcing member being made of a conductive member and electrically connected to the connection terminal pattern for grounding.

2. The IC card according to claim 1, wherein the insulating substrate has a through hole formed at a position corresponding to the connection terminal pattern for grounding, the reinforcing member has a projection portion projecting toward the insulating substrate, the projection portion is fitted in the through hole to position the reinforcing member, and the reinforcing member is electrically connected to the connection terminal pattern for grounding.

3. The IC card according to claim 1, wherein an outer periphery of the flange portion of the reinforcing member has almost a same shape as that of an outer periphery of the terminal plate.

4. The IC card according to claim 1, wherein the flange portion is adhered to the insulating substrate with an adhesive agent.

5. The IC card according to claim 4, wherein said flange portion includes a plurality of window holes for forming escape portions for an excessive adhesive agent.

6. The IC card according to claim 1, wherein the flange portion is adhered to the card base with an adhesive agent.

7. The IC card according to claim 1, wherein the reinforcing member is manufactured by drawing of a thin plate.

8. The IC card according to claim 1, wherein the reinforcing member is manufactured by forging.

9. The IC card according to claim 1, wherein the reinforcing member is manufactured by casting.

10. An IC card comprising:

a card base, and an IC module mounted on the card base and including an insulating substrate; a terminal plate arranged on a surface of the insulating substrate and having connection terminal patterns for external power supply, signal connection, and grounding; an IC chip mounted on a rear surface of the terminal plate and electrically coupled to the connection terminal patterns; a sealing member for the IC chip; and a reinforcing member for reinforcing the sealing member integrally formed of at least a ring portion for covering an outer periphery of the sealing member and a flange portion for covering a rear surface of the insulating substrate, said ring portion having a reinforcing rib located above the IC chip.

11. The IC card according to claim 10, wherein the insulating substrate has a through hole formed at a position corresponding to the connection terminal pattern for grounding, the reinforcing member has a projection portion projecting toward the insulating substrate, the projection portion is fitted in the through hole to position the reinforcing member, and the reinforcing member is electrically connected to the connection terminal pattern for grounding.

12. The IC card according to claim 10, wherein an outer periphery of the flange portion of the reinforcing member has almost a same shape as that of an outer periphery of the terminal plate.

13. The IC card according to claim 10, wherein the flange portion is adhered to the insulating substrate with an adhesive agent.

14. The IC card according to claim 10, wherein the flange portion is adhered to the card base with an adhesive agent.

15. The IC card according to claim 13, wherein said flange portion includes a plurality of window holes for forming escape portions for an excessive adhesive agent.

16. The IC card according to claim 10, wherein the reinforcing member is manufactured by drawing of a thin plate.

17. The IC card according to claim 10, wherein the reinforcing member is manufactured by forging.

18. The IC card according to claim 10, wherein the reinforcing member is manufactured by casting.

* * * * *